(12) United States Patent
Manninen et al.

(10) Patent No.: US 11,895,810 B2
(45) Date of Patent: Feb. 6, 2024

(54) COOLING ARRANGEMENT

(71) Applicant: ABB Schweiz AG, Baden (CH)

(72) Inventors: Jorma Manninen, Helsinki (FI); Mika Silvennoinen, Helsinki (FI); Joni Pakarinen, Helsinki (FI)

(73) Assignee: ABB Schweiz AG, Baden (CH)

( * ) Notice: Subject to any disclaimer, the term of this patent is extended or adjusted under 35 U.S.C. 154(b) by 26 days.

(21) Appl. No.: 17/369,514

(22) Filed: Jul. 7, 2021

(65) Prior Publication Data
US 2022/0015258 A1 Jan. 13, 2022

(30) Foreign Application Priority Data
Jul. 8, 2020 (EP) ..................... 20184712

(51) Int. Cl.
*H05K 7/20* (2006.01)
(52) U.S. Cl.
CPC .................... *H05K 7/209* (2013.01)
(58) Field of Classification Search
None
See application file for complete search history.

(56) References Cited

U.S. PATENT DOCUMENTS

| | | | |
|---|---|---|---|
| 10,739,830 B2* | 8/2020 | Lee | G11B 33/1406 |
| 11,112,839 B2* | 9/2021 | Rush | H05K 7/20336 |
| 11,297,727 B2* | 4/2022 | Manninen | H01L 23/3121 |
| 2012/0170221 A1* | 7/2012 | Mok | H01L 23/4332 |
| | | | 438/122 |
| 2017/0153066 A1* | 6/2017 | Lin | F28D 15/046 |
| 2017/0156240 A1* | 6/2017 | Silvennoinen | H05K 7/20936 |
| 2018/0090415 A1* | 3/2018 | Escobar-Vargas | H01L 23/427 |
| 2019/0130519 A1* | 5/2019 | Hu | G06F 1/185 |
| 2019/0230826 A1 | 7/2019 | Bourlier et al. | |
| 2019/0373761 A1* | 12/2019 | Silvennoinen | H05K 7/209 |
| 2020/0315064 A1* | 10/2020 | Agostini | F28D 15/0233 |

FOREIGN PATENT DOCUMENTS

CN 102769001 A 11/2012

OTHER PUBLICATIONS

European Search Report; Application No. EP20184712; Completed: Dec. 18, 2020: 2 Pages.

* cited by examiner

Primary Examiner — Courtney L Smith
(74) Attorney, Agent, or Firm — Whitmyer IP Group LLC

(57) ABSTRACT

A power electronic assembly includes a power electronic module having multiple of power electronic components and a cooling element. The cooling element is attached to a surface of the power electronic module and is arranged to transfer heat from the power electronic assembly to a cooling medium, wherein the assembly comprises multiple of vapour chambers arranged to transfer the heat generated by the multiple of power electronic components.

16 Claims, 6 Drawing Sheets

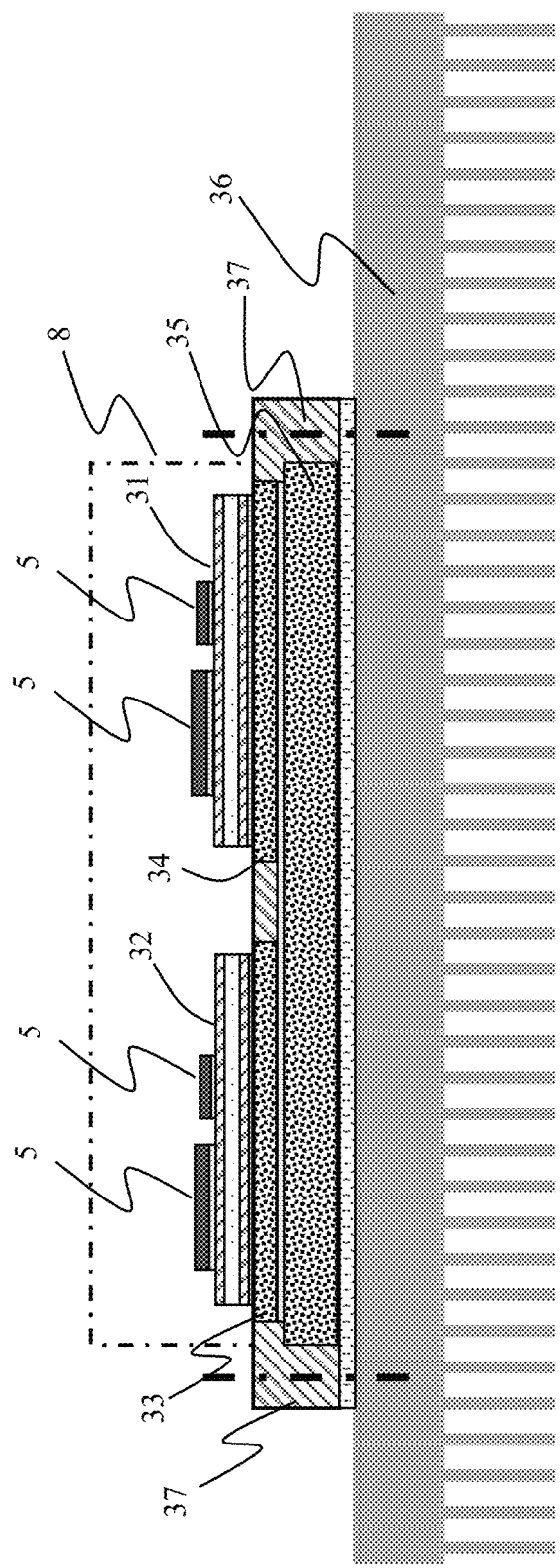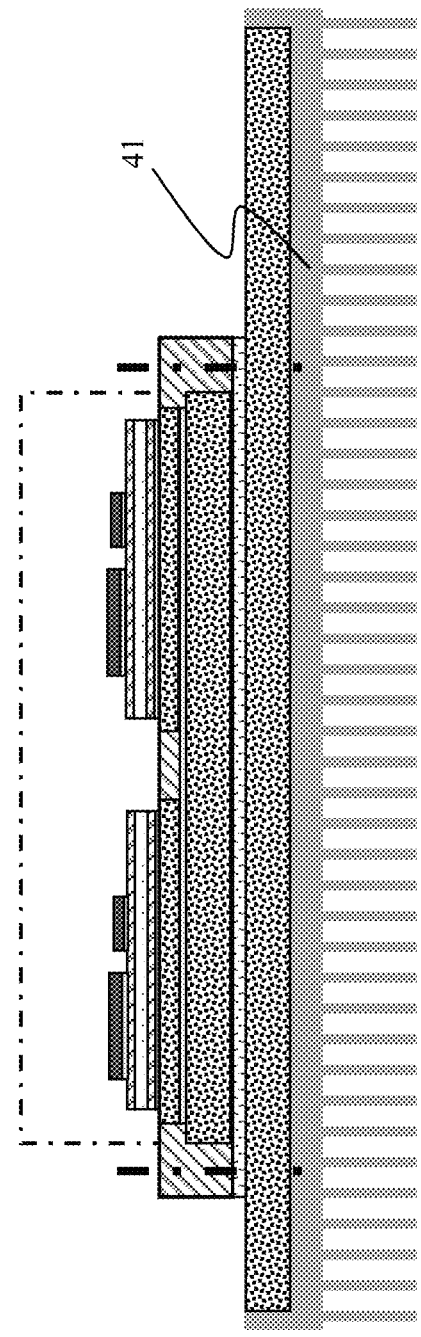

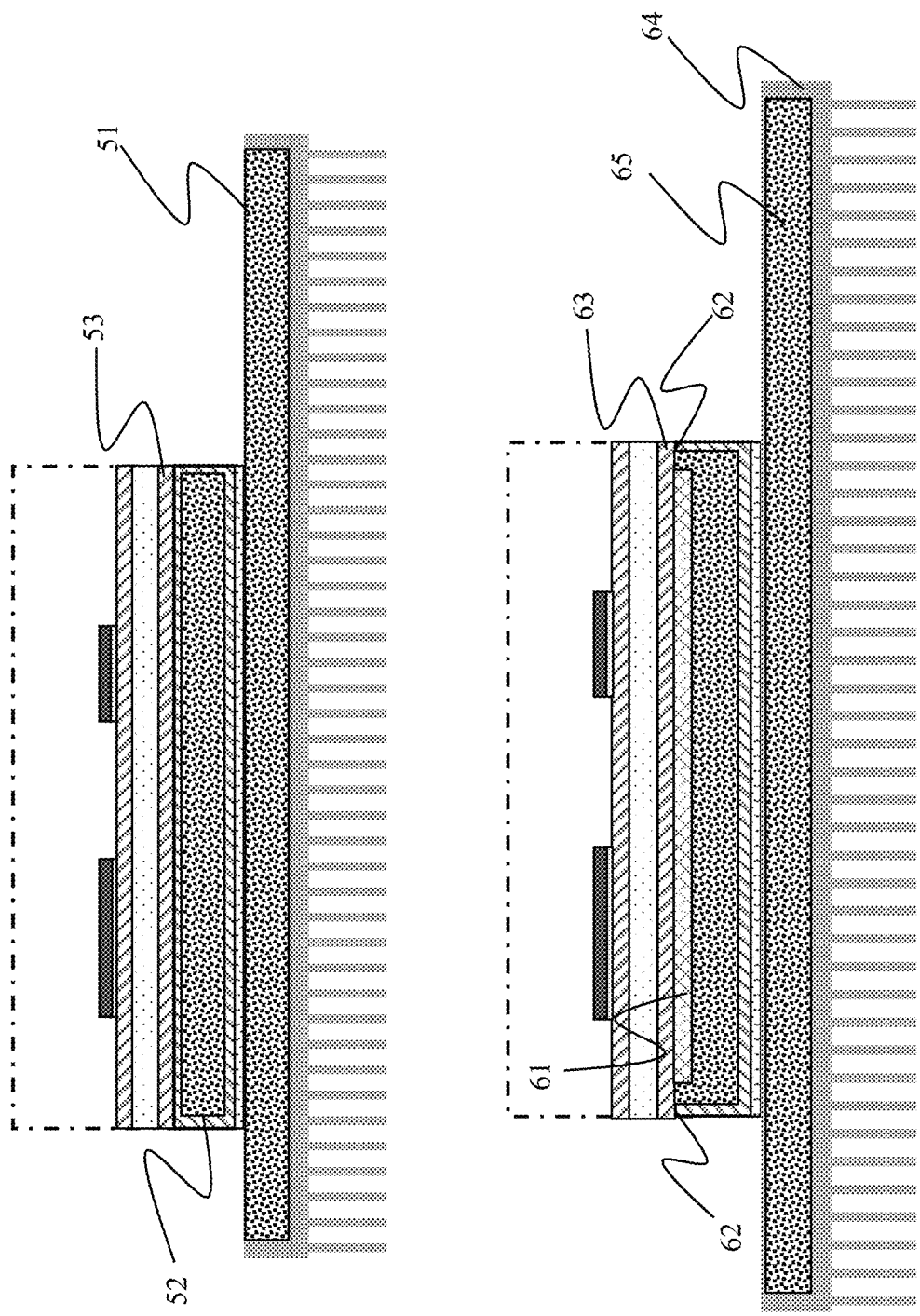

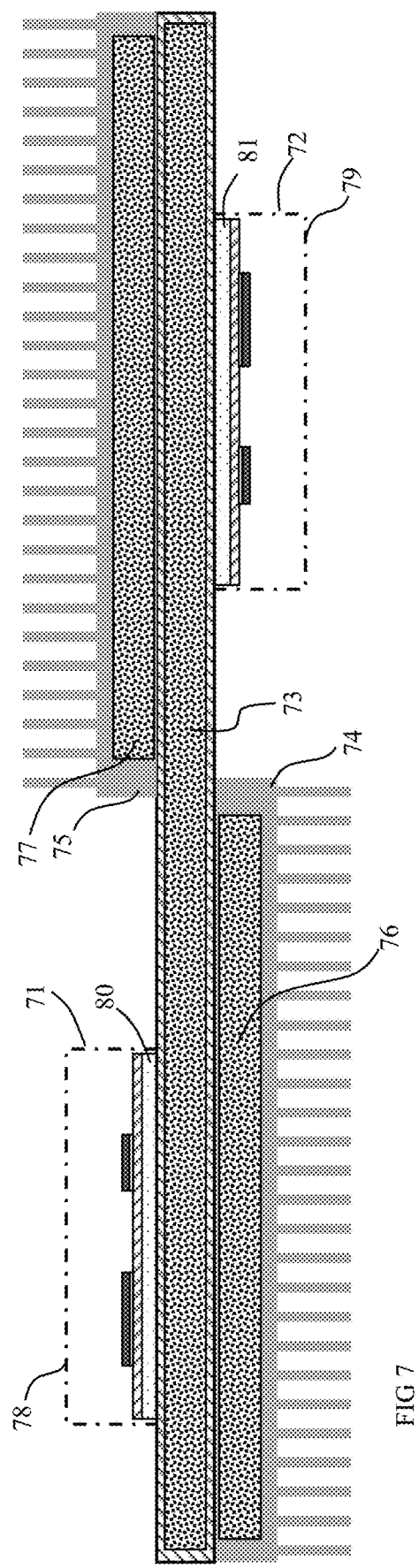
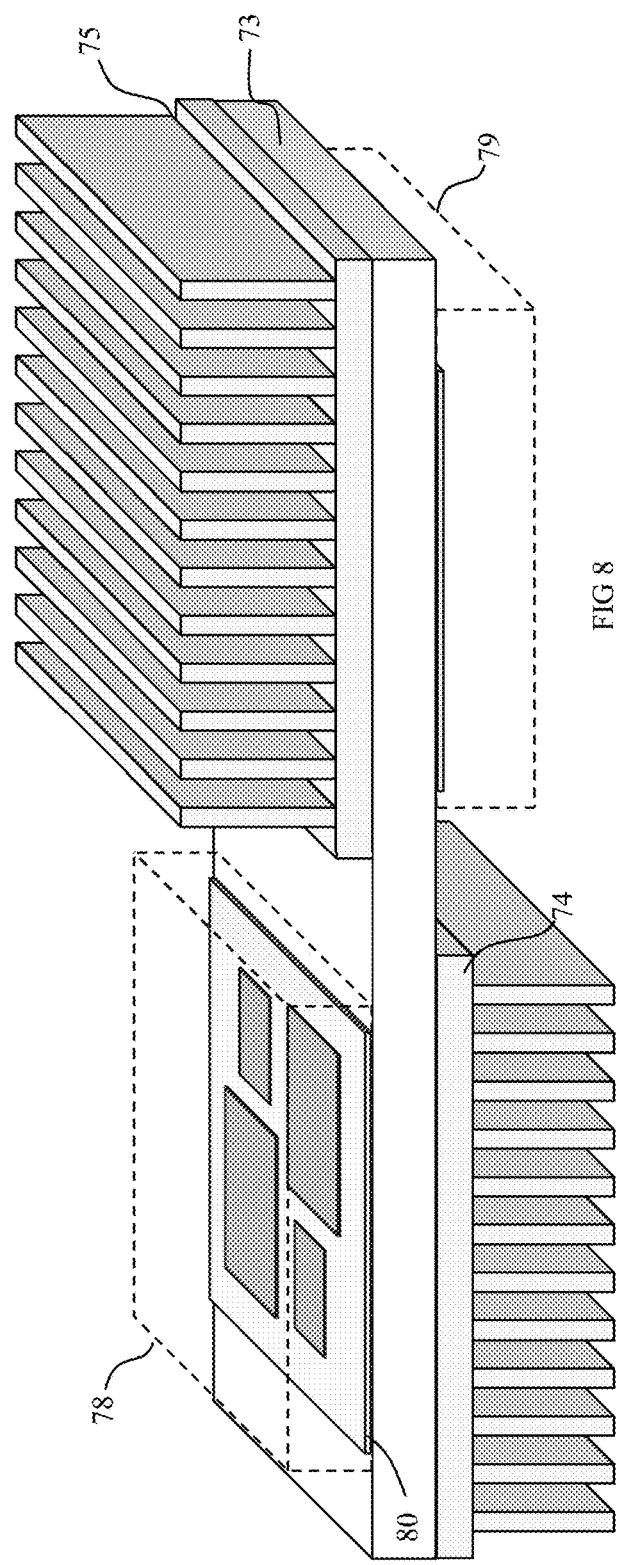
FIG 7
FIG 8

COOLING ARRANGEMENT

TECHNICAL FIELD

The invention relates to cooling of semiconductor devices, and particularly to cooling of power semiconductor modules.

BACKGROUND

Power electronic modules are commonly employed in power electronic devices. In devices like converters or inverters power electronic modules are used for switching high currents and high voltages. Power electronic modules comprise multiple of power electronic components, such as IGBTs and diodes, which may be internally wired so that power electronic modules can be used as a building blocks for power electronic devices.

In some devices, such as switching converters or inverters, the power electronic components are switched with a high frequency. The high frequency increases the losses of the module and the heat generated by the losses needs to be removed effectively from the components. In some cases the current and voltage limits of the semiconductor components cannot be reached as the cooling of the device is not efficient enough. That is, if the cooling was more efficient, the operating range of power electronic modules could be increased.

Power electronic modules are typically cooled using a heat sink or similar which is attached to a surface of the module. Typically a bottom surface of the power electronic module is attached tightly to a surface of a cooling element, such as a heatsink. The heat is further removed from the heatsink to a cooling medium. Heatsink may comprise cooling fins and the heat is removed to surrounding air. Another typical solution is to use cooling liquid to which the heat is transferred from the heat sink.

The surface of the power electronic module, i.e the bottom surface, to which the cooling element is attached is formed of a copper baseplate or of a ceramic plate. FIG. 1 shows an example of a known power electronic module in which a copper baseplate is used. FIG. 1 shows a cross-section of a power electronic module with two power electronic components 5. The components 5 are soldered to a substrate 2, which in FIG. 1 is a DBC substrate. The DBC substrate is formed of copper layers and a ceramic layer between the copper layers. The DBC substrate is further soldered with a solder layer 3 to a copper baseplate 1. A surface of the copper baseplate forms a bottom surface of the power electronic module. A cooling element 7 is attached to the bottom surface and a thermal interface material layer 6 is disposed between the baseplate and the cooling element. The power electronic module has further a housing 8 which surrounds the power electronic components and the substrate.

The heat from the components is mainly removed through the substrate and the baseplate to the heatsink. The heatsink of FIG. 1 transfers heat through the fins to the surrounding air.

It is known that vapour chambers may be integrated with various PCB assemblies and electronic modules such as LED modules. FIG. 9 shows an example of a vapour chamber in connection with a power electronic module application. In FIG. 9, a vapour chamber 91 is attached to a substrate or integrated in the baseplate of the module. It is thus considered that a vapour chamber may be designed to replace a conventional metal baseplate and the module corresponds to the power electronic module of FIG. 1. The power electronic module of FIG. 9 is shown without a cooling element. The cooling element may be attached to the bottom of the vapour chamber. However, the use of a vapour chamber in connection with a power electronic module may not produce required heat transfer properties to a cooling medium so as to enable compact device size.

In another alternative a power electronic module may be without the copper baseplate. In such a case the substrate is formed without the lower copper layer and the cooling element is attached directly to the ceramic layer of the substrate.

The transfer of heat in known assemblies is not efficient enough to enable utilizing the full operating range of the power electronic components of the power electronic modules.

SUMMARY

An object of the present invention is to provide a power electronic assembly and a power electronic device so as to overcome the above problem. The object of the invention is achieved by a structure which is characterized by what is stated in the independent claim. The preferred embodiments of the invention are disclosed in the dependent claims.

The invention is based on the idea of employing multiple of vapour chambers in transferring and spreading the heat generated in a power electronic module. The vapour chambers of the invention are arranged such that the heat is transferred from one vapour chamber to another vapour chamber. The advantage of using multiple of vapour chambers is that the heat from the components is spread and transferred effectively to the cooling element. The vapour chambers may also be employed to even the temperatures of the power electronic components of a module. When the temperatures of the components are made even, the properties of the components are changed in similar manner due to temperature.

An advantage of the assembly of the invention is that the operating area of power electronic components of the power electronic module may be utilized more completely. Further, the assembly of the invention may lead to reduced physical size than in known structures with same power ratings.

BRIEF DESCRIPTION OF THE DRAWINGS

In the following the invention will be described in greater detail by means of preferred embodiments with reference to the attached drawings, in which

FIGS. 2 to 7, 10 and 11 show cross sections of embodiments of invention; and

FIG. 8 shows a perspective view of the embodiment of FIG. 7.

DETAILED DESCRIPTION

A power electronic assembly of the invention comprises a power electronic module having multiple of power electronic components. The assembly further comprises a cooling element. The cooling element is attached to a surface of the power electronic module and is arranged to transfer heat from the power electronic assembly to a cooling medium. Further, the assembly comprises multiple of vapour chambers arranged to transfer the heat generated by the multiple of power electronic components.

Figure 1:
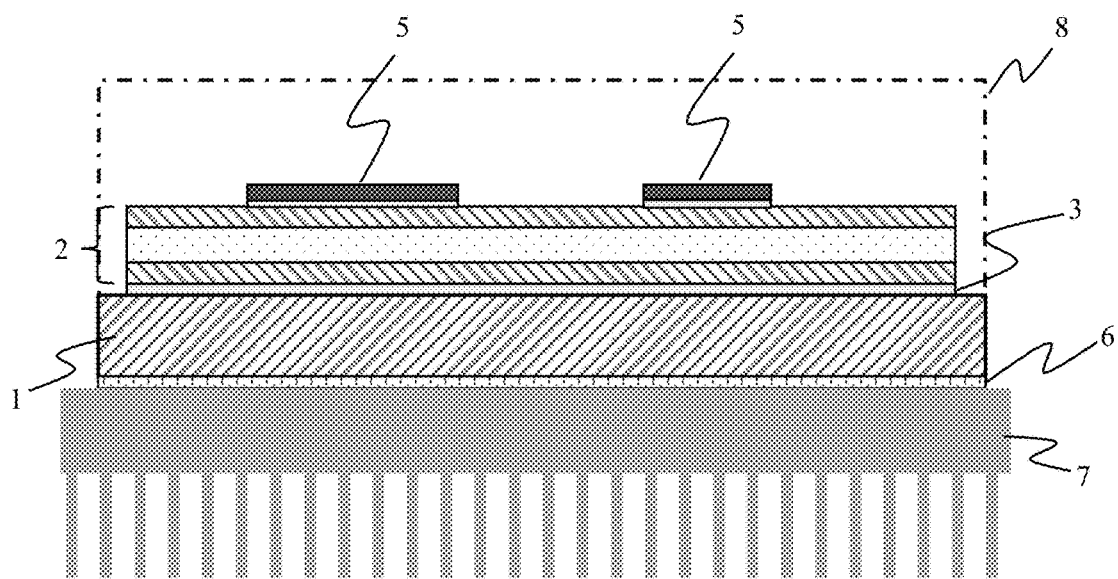
FIGS. 1 and 9 show cross sections of a known power electronic assemblies.
Figure 2:
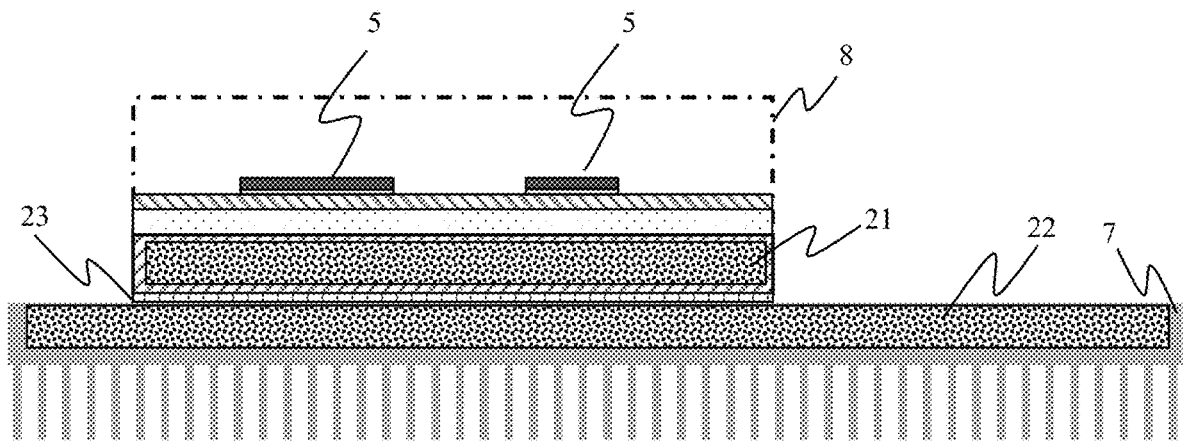
Figure 9:
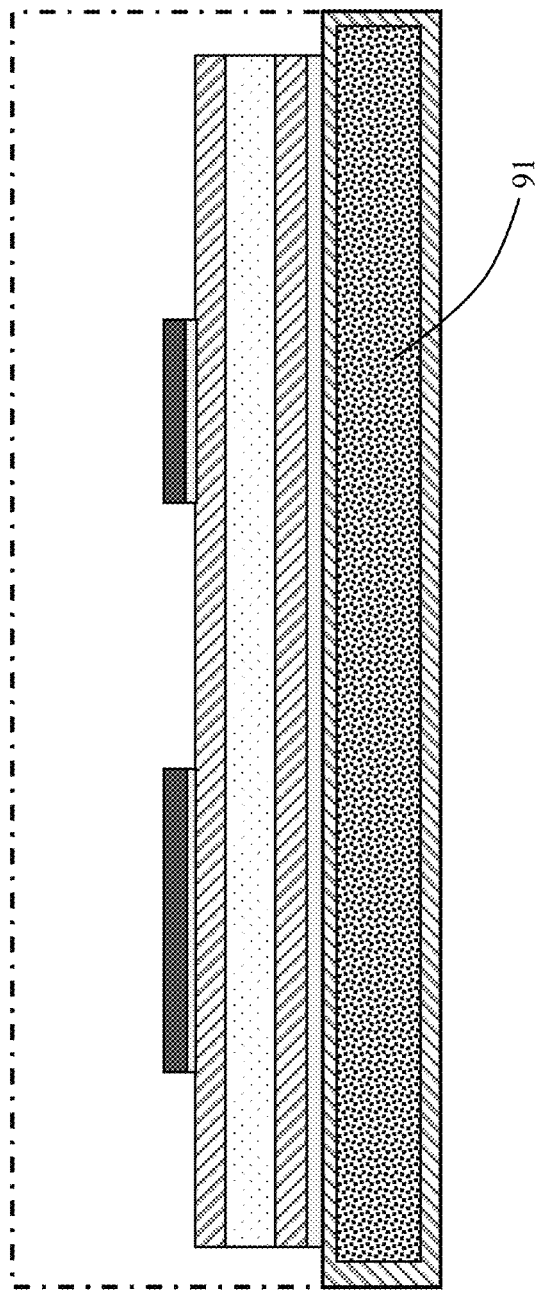

FIG. 2 shows an embodiment in which one vapour chamber 21 is present in the power electronic module and one other vapour chamber 22 is in the cooling element 7. In the example of FIG. 2, the vapour chamber 21 is attached directly to the ceramic of the substrate. The vapour chamber 21 is preferably soldered directly to the ceramic layer of the substrate. The material of the vapour chamber is preferably copper. The vapour chamber 22 of the cooling element 7 is preferably formed inside cooling element such that an opening is formed in the cooling element, such as heatsink, and the vapour chamber is placed in the opening. A surface of the vapour chamber 22 forms preferably a surface of the cooling element, such that the power electronics module can be set against the vapour chamber when attached to the cooling element. A thermal interface material may be applied between the two surfaces.

As the vapour chamber 21 of the power electronic module is attached to the ceramic of the substrate, the heat transfer path is made as short as possible such that heat from the heat generating components, i.e. the power electronic components, is transferred effectively to the vapour chamber.

Vapour chambers as such are known devices. In a vapour chamber a working fluid evaporates due to heat. The evaporated fluid travels inside the vapour chamber to a cooler place and condenses. When changing phase, the working fluid carries heat effectively. In FIG. 2, the heat evaporates the working fluid in the vapour chamber of the power electronic module. The working fluid then travels as vapour to a cooler place inside the chamber. When in a cooler place, it condenses to liquid, and removes heat. The condenser of the vapour chamber 21 can be considered to be in the bottom of the chamber, i.e. in the surface attached against the cooling element. The condenser of the vapour chamber 21 heats the vapour chamber 22, in which the working fluid again evaporates and condenses, and transfers and spreads heat effectively from the bottom surface of the power electronic module to the fins arranged in the cooling element.

In the invention, multiple of vapour chambers are employed. In the example of FIG. 2, two vapour chambers are arranged. One vapour chamber transfers the heat from the power electronic components 5 to the bottom surface of the power electronic module, while the other vapour chamber transfers the heat from the bottom surface of the power electronic module to the cooling element and to the cooling medium. The cooling medium is preferably air or liquid. As cooling fins are presented in FIG. 2, the cooling medium in the example is air.

To transfer heat efficiently from the power electronic module having a housing 8 to the cooling element 7, a thermal interface material layer 23 is disposed between the surfaces of the power electronic module and the cooling element. Instead of a separate thermal interface material layer, a soft layer of suitable material may also be attached directly to the surface of the power electronic module.

FIG. 3 shows another embodiment of the invention. As seen in the cross-section of FIG. 3, the power electronic module comprises multiple of vapour chambers. In the module of FIG. 3, multiple of power electronic components 5 or chips are situated on top of two separate DCB substrates 31, 32. The substrates are shown to have three layers, i.e. copper, ceramic, copper. Semiconductors are soldered on the top of the substrates. The substrates are further soldered to first vapour chambers 33, 34 of the multiple of vapour chambers. Thus each substrate is soldered on top of a respective vapour chamber. The two vapour chambers 33, 34 are further arranged on top of a third vapour chamber 35. Preferably, the two vapour chambers 33, 34 are soldered to the top of the larger vapour chamber. The mentioned three vapour chambers are thus all situated in the power electronic module. The power electronic module has a surface which is attached to a surface of a cooling element 36. Preferably, a thermal interface material layer is placed between the surfaces of the power electronic module and the cooling element. In operation, the smaller vapour chambers 33, 34 convey the heat from the power electronic components to the larger vapour chamber 35. The vapour chamber 35 further transfers the heat to the cooling element, such as a heatsink.

The vapour chambers in connection with the substrates spread and even the thermal losses of the power semiconductor components prior to conveying the heat to the vapour chamber with a larger volume. The larger vapour chamber spreads, evens and transfers the losses to the cooling element.

FIG. 3 shows also the housing 8 of the module and support structures 37, through which the module can be fixed mechanically to the cooling element.

FIG. 4 shows a modification of the structure of FIG. 3. FIG. 4 corresponds to FIG. 3 except in FIG. 4, also the cooling element comprises a vapour chamber 41. With a vapour chamber in the cooling element, the thermal resistance of the cooling element is lowered. Further, the response time of the cooling element is decreased so that the cooling element reacts faster to changes in temperature of the power electronic module.

In the embodiment of FIG. 5, one 52 of the multiple of vapour chambers is situated in the power electronic module and one other 51 is situated in the heat sink similarly as in connection with FIG. 2. In FIG. 2, the vapour chamber was attached to the ceramic layer of the substrate. However, in FIG. 5 the vapour chamber is attached to the copper layer 53 of the DBC substrate. The vapour chamber is attached preferably by soldering a surface of the vapour chamber to a surface of the substrate.

FIG. 6 shows another embodiment of the invention. In the embodiment vapour chambers are as in the embodiment of FIG. 5, i.e. one vapour chamber is in the power electronic module and one other vapour chamber is in the cooling element. In the embodiment, the vapour chamber is built directly on a DBC substrate and the bottom copper layer 63 of the substrate is used as a surface to which the vapour chamber is built.

FIG. 6 shows that a wick structure 61 is attached or machined to the copper layer. Wick structures are not shown in other embodiments of the invention. The wick structures may include layers of sintered copper powder, copper wire mesh or machined micro grooves. Further, the vapour chambers may also include various other structure inside the chamber which are not shown in the drawings. These structures may increase the mechanical strength of the chamber, enhance vapour flow, or enhance the fluid transportation inside the chamber by capillary action, for example.

FIG. 6 further shows that the walls forming the vapour chamber are attached to the copper layer of the substrate. The vapour chamber is a box-like structure, and the copper layer of the substrate forms the top cover of the structure. The rest of the box-like structure, i.e. side walls and bottom wall is preferably in one piece and is attached to the copper layer by welding or soldering, and the bondline 62 between the substrate copper layer and the rest of the vapour chamber is shown in the cross-section of FIG. 6. Once the wick structure and other structures are attached or prepared to the copper layer of the substrate or to the other structures that make up the chamber, the chamber is closed and finalized. For finalizing the vapour chamber, a port is needed to fill in the working fluid.

As shown in FIG. 6, a cooling element 64 with a vapour chamber 65 is attached to a surface of the power electronic module. Preferably, a thermal interface material layer is placed between the power electronic module and the cooling element.

FIG. 7 shows another embodiment of the invention. In the embodiment a power electronic module is formed of modules 71, 72 attached to a surface of a vapour chamber 73. Further, two cooling elements 74, 75 are attached to the surface of the vapour chamber 73. In the embodiment, both cooling elements comprise a vapour chamber 76, 77. In the embodiment, the substrates are attached to the surface of the vapour chamber 73 through their ceramic layers 80, 81 of the substrates. The connection between the substrates and the vapour chamber is similar to that of FIG. 2.

In the embodiment of FIG. 7, one vapour chamber is common to two modules 71, 72. The vapour chamber effectively transfers and spreads heat from the modules and also balances the temperatures between the modules. In the example, a power electronic module is considered to be formed of the vapour chamber and the substrates attached to the vapour chamber. FIG. 8 shows a perspective view of the structure of FIG. 7. In FIG. 7, the vapour chambers inside the cooling elements are not visible.

Figure 10:
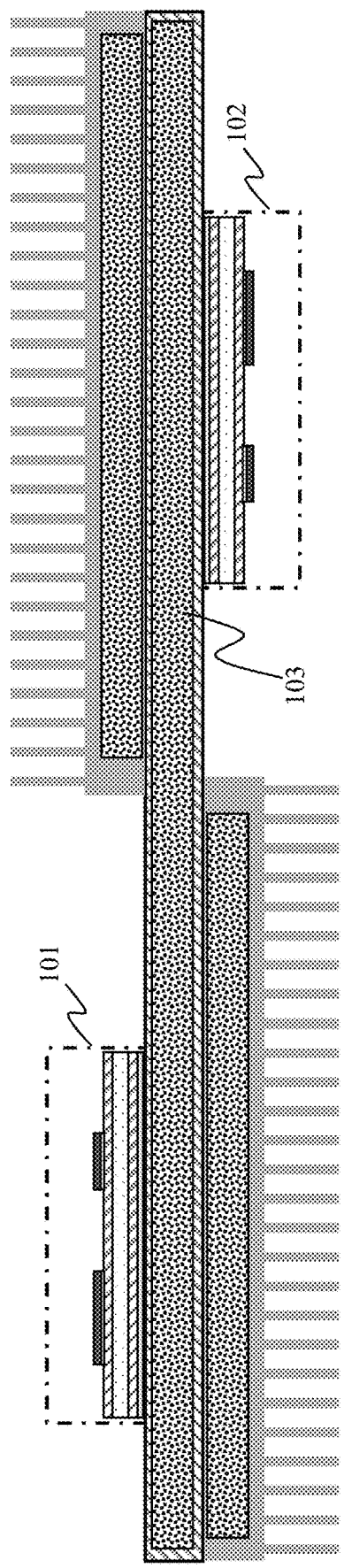
Figure 11:
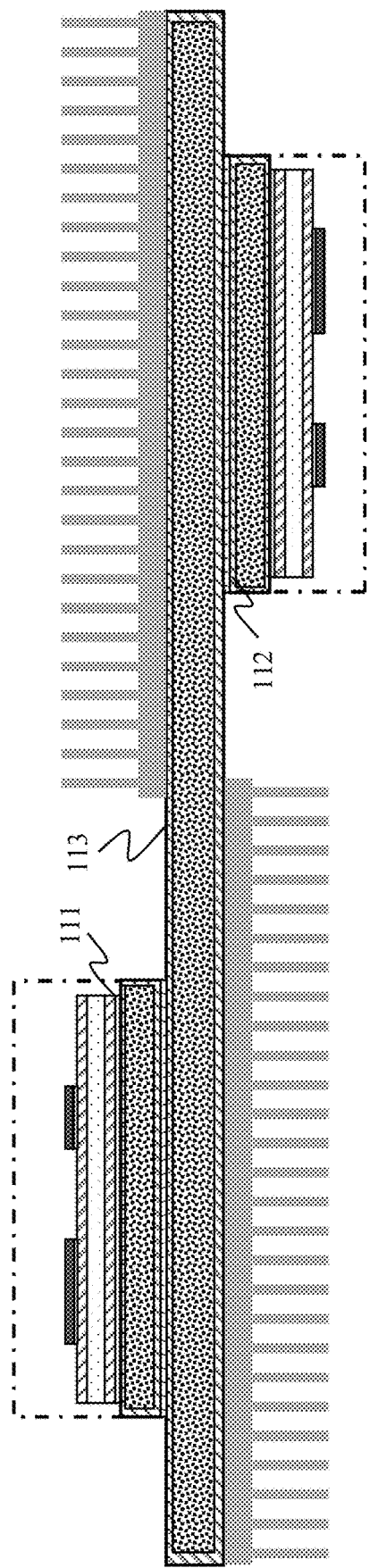

FIGS. 10 and 11 show modifications of the structure presented in FIGS. 7 and 8. FIG. 10 differs from the embodiment shown in FIG. 7 in that the two power electronic modules 101, 102 are attached through their substrates to a common vapour chamber 103. More specifically, a copper plate of the substrate of each module is attached to the vapour chamber 103. The cooling elements of the embodiment each comprise vapour chambers.

In FIG. 11, the substrates are attached to separate vapour chambers 111, 112 which again are attached to a common vapour chamber 113. Further, cooling elements are attached to the common vapour chambers as in FIG. 10.

In all embodiment shown in the drawings the cooling element shown is a heatsink with fins. Such cooling elements are preferably used in connection with air as a cooling medium and the heat from the assembly is transferred to air. Another possibility for a cooling element is a liquid cooled cooling element. In a liquid cooled element heat is transferred to a circulating liquid. In each of the above embodiments the cooling element can be a liquid cooled cooling element without any necessary modification to the other structures.

The power electronic assembly is employed in a power electronic device. Such a device is, for example, a converter which can be employed in various uses. A converter is preferably a frequency converter in which power electronic modules are commonly used. A typical use of a frequency converter is in a motor drive in which the frequency converter is used in controlling the rotation of an electric motor.

Vapour chamber may be manufactured using additive manufacturing procedures, such as 3D-printing. The use of additive manufacturing methods enable to produce vapour chamber designs which would be challenging to produce using traditionally used manufacturing methods. Such designs include, for example, thin vapour chambers having height of less than one millimetre. Such thin vapour chambers can be applied, for example, in mobile devices, including laptop computers and mobile phones. 3D-printing enables also to produce complicated vapour chamber structures.

Additive manufacturing methods, such as 3D-printing, enables to produce thermal structures without additional thermal boundaries. For example, a thermal structure with one or more vapour chambers may be produced without thermal boundaries and thermal resistances relating to thermal boundaries. Such a thermal system may also include cooling fins from which the heat can be transferred to a coolant, such as a fluid. In view of the above, with additive manufacturing methods structures can be formed to be without thermal boundaries. For example multiple of vapour chambers may be formed to a single structure having also cooling fins.

The enclosed drawings are presented for better understanding the invention and various embodiments of the invention. The drawings are not necessarily in scale and some parts of the structures may be shown larger or smaller than other parts for illustrative purposes.

It will be obvious to a person skilled in the art that, as the technology in advances, the inventive concept can be implemented in various ways. The invention and its embodiments are not limited to the examples described above but may vary within the scope of the claims.

The invention claimed is:

1. A power electronic assembly comprising:
a power electronic module having multiple power electronic components and a cooling element, wherein the cooling element is attached to a surface of the power electronic module and is arranged to transfer heat from the power electronic assembly to a cooling medium, wherein the assembly comprises multiple vapour chambers arranged to transfer heat generated by the multiple power electronic components, wherein at least one vapour chamber of the multiple vapour chambers is arranged to transfer heat to another vapour chamber of the multiple vapour chambers;
wherein the power electronic module comprises a substrate having an upper surface and a lower surface, wherein the multiple power electronic components are attached to the upper surface, and wherein at least one of the multiple vapour chambers is attached to the lower surface of the substrate.

2. The power electronic assembly according to claim 1, wherein the at least one of the multiple vapour chambers is arranged in the power electronic module and at least one other of the multiple vapour chambers is arranged in the cooling element.

3. The power electronic assembly according to claim 1, wherein at least two vapour chambers of the multiple vapour chambers are arranged in the power electronic module.

4. The power electronic assembly according to claim 1, wherein the substrate is a DBC substrate having a layer of copper and a layer of ceramic, wherein the at least one of the multiple vapour chambers is attached to the layer of ceramic.

5. The power electronic assembly according to claim 1, wherein the substrate is a DBC substrate having two layers of copper, wherein the at least one of the multiple vapour chambers is attached to one of the two layers of copper.

6. The power electronic assembly according to claim 5, wherein a surface of the at least one of the multiple vapour chambers is formed of said one of the two layers of copper.

7. The power electronic assembly according to claim 3, wherein the power electronic module comprises at least two substrates to which the power electronic components are attached, wherein for each substrate, one of the at least two vapour chambers is arranged to receive heat from the substrate, and wherein at least one of the multiple vapour chambers is arranged to receive heat from the at least two vapour chambers.

8. The power electronic assembly according to claim 1, wherein at least two of the multiple vapour chambers are arranged to transfer heat from one vapour chamber to another vapour chamber.

9. The power electronic assembly according to claim 1, wherein at least one of the multiple vapour chambers is produced using an additive manufacturing method.

10. A power electronic device comprising:
a power electronic assembly including a power electronic module having multiple power electronic components and a cooling element, wherein the cooling element is attached to a surface of the power electronic module and is arranged to transfer heat from the power electronic assembly to a cooling medium, wherein the assembly comprises multiple vapour chambers arranged to transfer the heat generated by the multiple power electronic components, wherein at least one vapour chamber of the multiple vapour chambers is arranged to transfer heat to another vapour chamber of the multiple vapour chambers;
wherein the at least one of the multiple vapour chambers is arranged in the power electronic module and at least one other of the multiple vapour chambers is arranged in the cooling element;
wherein the power electronic module comprises a substrate having an upper surface and a lower surface, wherein the multiple power electronic components are attached to the upper surface, and wherein at least one of the multiple vapour chambers is attached to the lower surface of the substrate.

11. The power electronic device according to claim 10, wherein the power electronic device is a converter.

12. The power electronic device according to claim 10, wherein the power electronic device is a frequency converter.

13. The power electronic assembly according to claim 1, wherein the power electronic module comprises at least two substrates to which the power electronic components are attached,
wherein for each substrate, one of at least two vapour chambers of the multiple vapour chambers is arranged to receive heat from the substrate, and
wherein at least one of the multiple vapour chambers is arranged to receive heat from the at least two vapour chambers.

14. The power electronic assembly according to claim 2, wherein at least two of the multiple vapour chambers are arranged to transfer heat from one vapour chamber to another vapour chamber.

15. The power electronic assembly according to claim 2, wherein at least one of the multiple vapour chambers is produced using an additive manufacturing method.

16. A power electronic assembly comprising:
a power electronic module having multiple power electronic components and a cooling element, wherein the cooling element is attached to a surface of the power electronic module and is arranged to transfer heat from the power electronic assembly to a cooling medium, wherein the assembly comprises multiple vapour chambers arranged to transfer heat generated by the multiple power electronic components, wherein at least one vapour chamber of the multiple vapour chambers is arranged to transfer heat to another vapour chamber of the multiple vapour chambers;
wherein at least two vapour chambers of the multiple vapour chambers are arranged in the power electronic module;
wherein the power electronic module comprises at least two substrates to which the power electronic components are attached,
wherein for each substrate, one of the at least two vapour chambers is arranged to receive heat from the substrate, and
wherein at least one of the multiple vapour chambers is arranged to receive heat from the at least two vapour chambers.

* * * * *